United States Patent [19]

Yasuraoka et al.

[11] Patent Number: 5,282,659
[45] Date of Patent: Feb. 1, 1994

[54] CHUCK FOR POSITIONING CHIP ELECTRONIC ELEMENTS

[75] Inventors: Kazuya Yasuraoka; Kazuo Ujiie, both of Tokyo, Japan

[73] Assignee: Limited Company Matsumoto Giken, Tokyo, Japan

[21] Appl. No.: 837,883

[22] Filed: Feb. 20, 1992

[51] Int. Cl.$^5$ ............................................... H05K 3/32
[52] U.S. Cl. ........................................ 294/2; 294/64.1; 294/116; 294/119.1
[58] Field of Search ............... 294/2, 64.1, 116, 119.1

[56] References Cited

U.S. PATENT DOCUMENTS

| | | | |
|---|---|---|---|
| 4,860,438 | 8/1989 | Chen | 294/2 X |
| 4,866,824 | 9/1989 | Falk et al. | 294/2 X |
| 4,950,011 | 8/1990 | Borcea et al. | 294/2 |
| 5,056,844 | 10/1991 | Takabayashi | 294/2 X |

Primary Examiner—Joseph D. Pape
Attorney, Agent, or Firm—Pollock, Vande Sande & Priddy

[57] ABSTRACT

A head case accommodates an axially movable suction nozzle that holds an electric component on a chip by suction at its center. At least four jaws, which are disposed around the center axis of the suction nozzle and adapted to move parallel to the bottom plate of the head case through guide slots radially extending with respect to the same axis, are attached to the bottom plate. Two each of the facing jaws on both sides of the axis are coupled together by means of links and always urged toward the suction nozzle by springs. While expanding rods actuated by pistons open the jaws, the suction nozzle picks up the electric component on a chip by suction. When released on completion of the pick-up, the jaws urged by the springs move an equal distance toward the axis of the suction nozzle parallel to the surface of the bottom plate to squarely hold the four sides of the electric component on a chip, with its center thus held in alignment with the axis of the suction nozzle.

8 Claims, 12 Drawing Sheets

CHUCK FOR POSITIONING CHIP ELECTRONIC ELEMENTS

BACKGROUND OF THE INVENTION

This invention relates to apparatus for placing in position on printed circuit boards electronic elements that are taken out of a series of equally spaced packing recesses provided along the length of a tape.

Chip Electronic elements widely used for surface packaging are supplied to users with a reeled base tape having recesses of conforming size to contain individual elements that are provided at equal intervals along the length of the base tape and covered with a detachable cover tape.

A packaging apparatus that uses such component chips supplied in the packing recesses on a tape have an air-cylinder-driven sprocket whose teeth engage with the perforations of the base tape to feed forward the tape and a take-up reel that is intermittently driven by an air cylinder to remove the cover tape away from the base tape so that one chip after another is exposed in the desired position.

A nozzle connected to a vacuum source sucks the exposed chip in position to take it out of the packing recess, with the nozzle and the chip thus removed being then jointly carried to the desired position on a printed circuit board.

Component chips of this type have leads at given points of their packages to establish connection with external circuits. To establish an electric connection with the printed pattern on a circuit board, therefore, each chip must be oriented in conformance therewith. To meet this requirement, the chucks according to U.S. Pat. No. 4,135,630 and Japanese Provisional Utility Model Publication No. 78288 of 1987 have a chip position corrector at the tip of a nozzle that adjusts the direction and position of a chip sucked thereby over a given angle with respect to the reference position of the nozzle.

Figure 15:
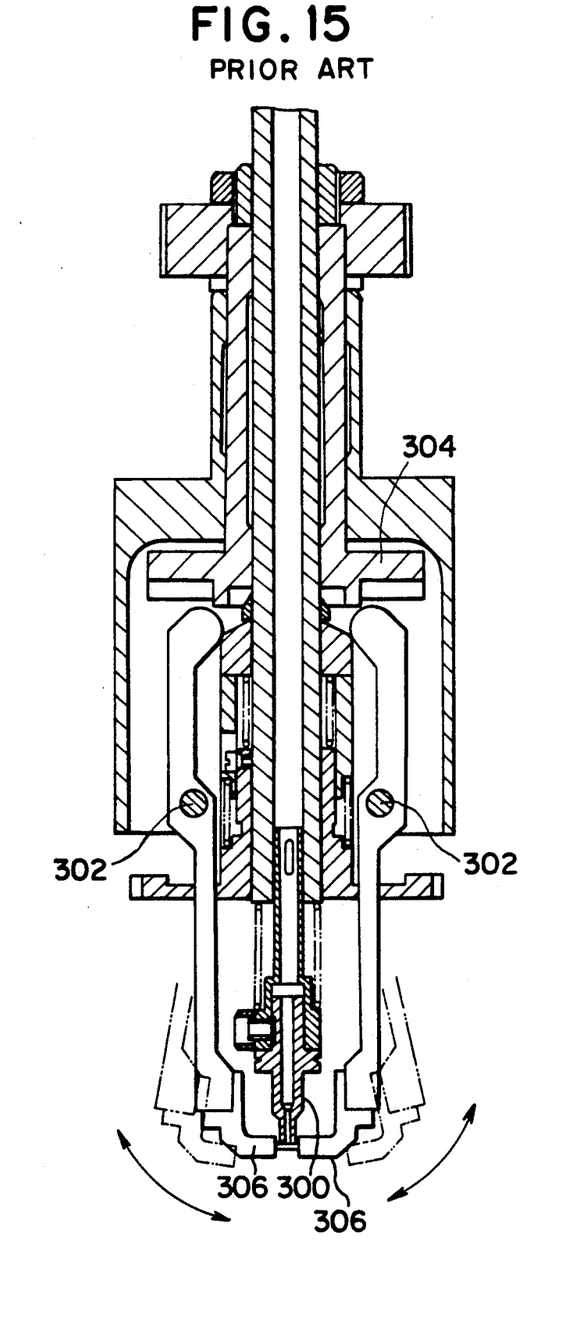
FIG. 15 is a cross-sectional view of a conventional component chip mounting chuck.

FIG. 15 shows an example of the chucks just mentioned which comprises a vertically movable suction nozzle 300 positioned at the center and surrounded by four adjustable jaws 306 which are rotatably mounted on pivots 302 and turned by an external drive unit 304.

When brought in contact with a chip surrounded by the tips of the expanded jaws 306 (as indicated by the double-dot-dash line in the figure), the suction nozzle 300 draws the chip to the tip thereof. Then the tips of the jaws 306 come in contact with the chip drawn to the suction nozzle 300 when they are turned thereto by means of the drive unit 304, whereupon the orientation of the chip is changed in conformance with the position and direction of the jaws 306. The adjustment of the chip posture according to the position and direction determined by the jaws 306 permits positioning each chip in exact agreement with the circuit pattern printed on the board.

Now that the jaws 306 turn about the pivots 302 when grasping a chip, the suction nozzle 300 inevitably moves axially. Besides, the long distance between the tips of the jaws and the pivots on which they turn causes a considerable play at the grasping tips of the jaws. Such axial movement and play make the holding of component chips of ultra-small sizes of the order of one millimeter square and the correction of their position and direction extremely difficult.

SUMMARY OF THE INVENTION

In order to solve the above problems, a chuck according to this invention comprises a head segment that accommodates an axially movable suction nozzle to hold a component chip by the action of vacuum that is passed through the center thereof, the head segment having a bottom plate to carry at least four jaws that are adapted to move radially with respect to the axis of the suction nozzle and parallel to the bottom plate and positioned symmetrically with respect to said axis, links to connect two facing jaws disposed on both sides of said axis, spring-loading members to urge the jaws toward said axis, a motion converting device whose axial motion causes the jaws to move radially, and a drive unit that causes the suction head to move parallel to said axis.

An object of this invention is to provide an improved chuck that opens and closes the jaws to hold a component chip without imparting a rotary motion thereto.

Another object of this invention is to provide a chuck that holds the four sides of a component chip held in position by the suction nozzle with the jaws that are accurately guided radially and parallel to the surface of the bottom plate and aligns the center of the component chip with the axis of the suction nozzle by moving the facing jaws an equal distance by adjusting the links.

Yet another object of this invention is to provide a chuck that accurately places a component chip of an extremely small size, such as 0.5 mm by 1.0 mm by 0.5 mm in width, length and thickness, in the desired position on a printed circuit board, with the center thereof accurately aligned with the axis of the suction nozzle.

Still another object of this invention is to provide a chuck that is capable of quickly moving and bringing to a sudden stop the head segment when changing the position of a component chip on account of the reduced moment of inertia of the head segment that results from the coaxial arrangement of the drive unit and other heavier component parts with the suction nozzle.

Other objects and effects of this invention will be made explicit in the following detailed description of preferred embodiments of this invention.

DETAILED DESCRIPTION OF THE PREFERRED EMBODIMENTS

Now a detailed description of the preferred embodiments of this invention given below should be read by reference to the accompanying drawings.

Figure 1:
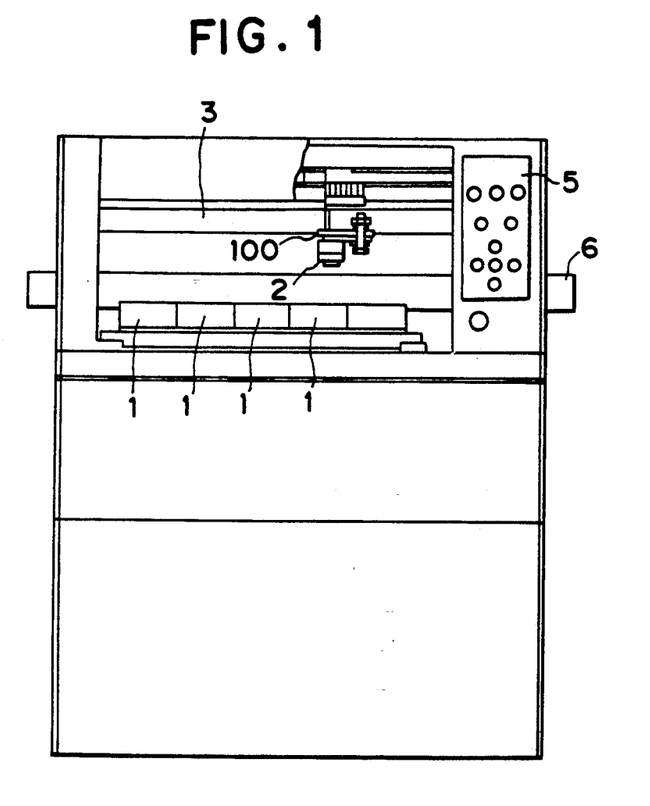
FIG. 1 is a schematic front view of an automatic assembling machine employing a chuck according to this invention.

FIG. 1 shows an example of an automatic electronic circuit assembling machine suited for use with a chuck according to this invention. Reference numeral 1 in the figure designates a component chip feeder to be described later. The number of chip feeders 1 mounted are equal to the number of the types of component chips to be used in the circuit. The chuck 2 can make two-dimensional(X-Y) motions by means of a drive unit 3 connected through a base 100.

This machine is designed to fix a printed circuit board fed by a feeding belt conveyor 6 in place and mount necessary electronic elements thereon in accordance with the instructions given by a teaching program input from a console panel 5.

Figure 2:
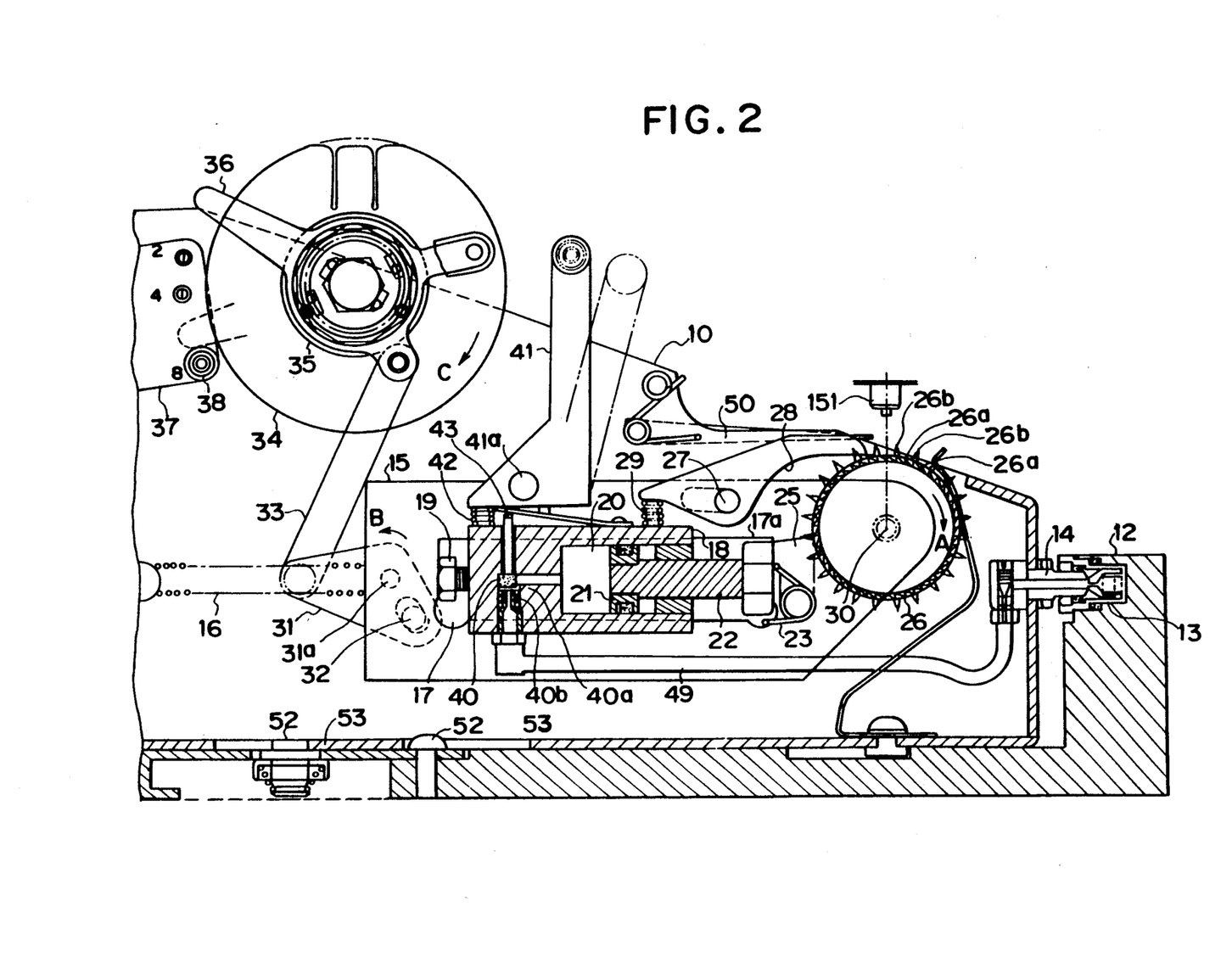
FIG. 2 is a front view showing an example of a component chip feeder.

FIG. 2 shows an example of the component chip feeder mentioned before. Reference numeral 10 designates a base that carries a reel bracket ,not shown, to support a reel of a component chip feeding tape at the upper left end thereof and a coupler 14 engaging with an air-feed coupler 13 of an automatic assembling machine 12 at the opposite end.

Reference numeral 15 denotes a slider that is movable parallel to the base 10, always urged in one direction (to the left in the figure) by a spring 16 whose one end is fastened to the base 10, and provided with a window 17 in the middle thereof. Reference numeral 18 indicates an air cylinder block that is fastened to the base 10 to cause the slider 15 to slide through the window 17 provided therein or to guide the slider 15 to move relative to the base 10.

The air cylinder block 18 has a positioning screw 19 contacting the window 17 of the slider 15 at the rear end thereof and a cylinder room 20 to accommodate a piston 21 in the middle. When air is supplied, the piston 21 forces out a piston rod 22 to press a pawl 25, which is kept in contact with the forward end 17a of the window 17 of the slider 15 and urged toward the piston 21 by a spring 23, against a ratchet 26.

Figure 3:
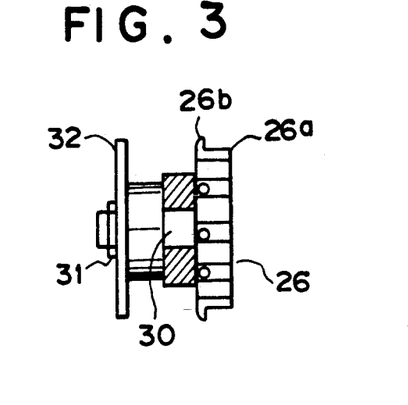
FIG. 3 shows an assembly containing a ratchet wheel used in the feeder of FIG. 2.

The ratchet 26 is rotatably mounted on a rotating shaft 30 at the forward end of the slider 15, with teeth 26a whose profile is made up of a gently inclined face and a substantially vertical face and projections 26 engaging with the guide perforations in a component chip feeding tape 60 provided around the periphery thereof. Engaging with a feeding claw 28 that is rotatably mounted on a rotating shaft 27 on the base 10 and always urged toward the ratchet 26 by a spring 29, the teeth 26a rotate the ratchet 26 a distance corresponding to the stroke of the piston 21 in the direction of the arrow A when the slider 15 is pulled back to the left in the figure. A tape guide reel 32 is fastened to the rotating shaft 30 of the ratchet 26 with a check pin 31, as shown in FIG. 3.

Referring back to FIG. 2, reference numeral 31 designates a bell crank rotatably mounted on a shaft 31a on the base 10, with a slot at one end thereof engaging with a pin 32 fastened to the slider 15 and the other end connected to a one-way constant-torque friction clutch 35 on a take-up reel 34 through a rod 33. A rotation limiting arm 36 attached to the one-way constant-torque friction clutch 35 limits the rotating angle of the bell crank 31 at a pin 38 on a rotation stopper 37 fastened to the base 10, thereby bringing the length of the return stroke of the slider 15 in agreement with the pitch between adjoining component chips carried by the feeding tape.

Reference numeral 40 denotes a valve body interlocking with an arm 41 that moves when the head of a chuck2 (shown in FIG.1) moves. When the chuck 2 retreats, a spring 42 moves the arm 41 about a shaft 41a as indicated by the dot-dash line to press down an actuating rod 43. As a consequence, the valve body 40 cuts off the communication with an air supply source through a tube 49 while bringing a cylinder chamber 20 into communication with the atmosphere. When the chuck 2 moves forward to press the arm 41 (as indicated by the solid line), a spring 40b pulls up the actuating rod 43 to cut off the communication with the atmosphere while bringing the air supply source into communication with the cylinder chamber 20.

Reference numeral 50 designates a member to fold back the cover tape provided behind, or on the left in the figure, of the point where a suction nozzle 151 of the chuck 2 comes down.

Figure 4A:
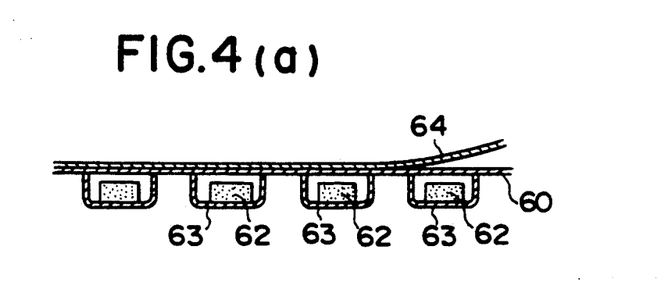
FIG. 4 shows cross-sectional views of an example of a component chip feeding tape at (a) and (b).
Figure 4B:
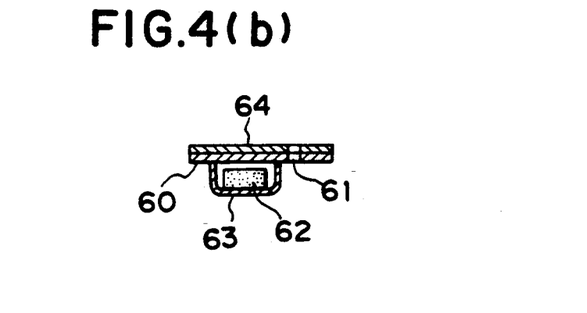

FIG. 4 shows an example of component chips encapsulated in recesses provided on a carrying tape. Reference numeral 60 indicates a base tape, with regularly spaced guide perforations 61 provided on one side thereof and regularly spaced recesses 63 to contain chip electronic elements 62 in the middle. Reference numeral 64 denotes a detachable cover tape to cover the top of each recess 63 that is attached to both sides of the base tape 60.

In the component chip feeder just described, a reeled tape carrying chip electronic elements is mounted on a reel bracket not shown and the leading end thereof is pulled out to the reel 32 along a guide, with the base tape 60 facing downward, the perforations 61 in the base tape 60 engaged with a pin 26b, and the cover tape 64 folded back upward by the back-folding member 50 and placed on the take-up reel 34.

When the base 10 is set in position by inserting connecting projections 52 thereof in mating holes 53 in the assembling machine 12, air is supplied through couplers 13 and 14.

Figure 5A:
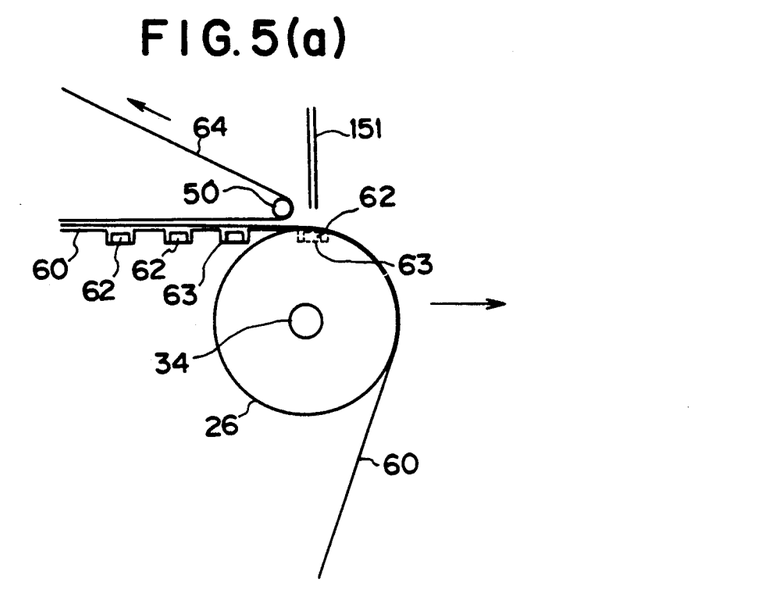
FIG. 5 schematically shows motions of the same component chip feeder at (I) and (II).
Figure 5B:
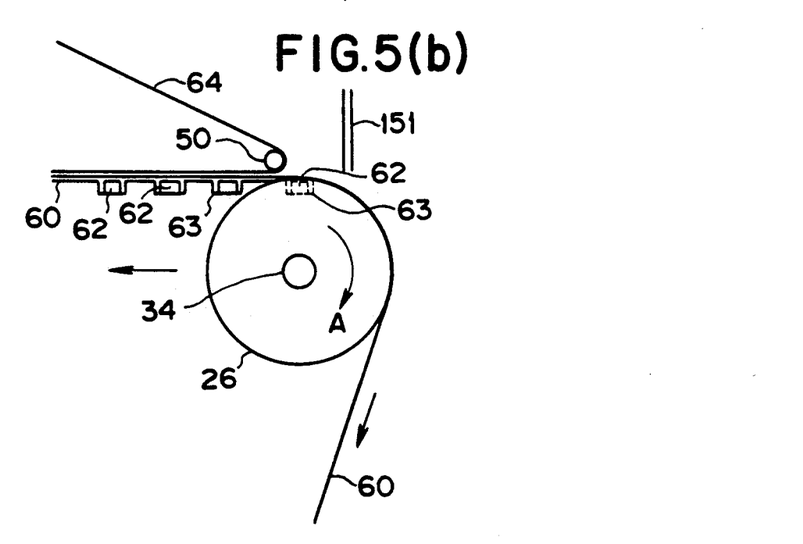

When the chuck 2 to be described later then moves to press the arm 41, the valve body 40 opens to send the air into the cylinder chamber 20, whereby the piston 21 moves toward the ratchet 26 (at the right in the figure). The slider 15 pushed by the piston rod 22 moves to the right in the figure relative to the base 10. Even if the ratchet 26 comes in contact with the feeding claw 28 in this pressing process, the pawl 25 that is pressed against the ratchet 26 by the rod 22 prevents the rotation thereof. At the same time, the bell crank 31 also rotates about the shaft 31a (as indicated by the arrow B) as the slider 15 moves. Then, the one-way constant-torque friction clutch 35 turns the take-up reel 34 in the direction of the arrow C, whereby the reel 34 takes up the cover tape 64 of a length corresponding to the length of the base tape 60 pulled out by the movement of the slider 15 (as shown at (I) in FIG. 5). When the piston 21 reaches the top dead center, the slider 15 stops moving to complete the feed of one pitch of the tape or one component chip carried thereby. The component chip 62 in a recess 63 on the base tape 60 is then exposed for removal by a suction nozzle 151 on the assembling machine.

When the chuck retreats from the arm 41 after the component chip has been picked up by the tip of the suction nozzle 151, the spring 42 moves the arm 71 to the position indicated by the dot-dash line in the figure, whereby the valve body 40 cuts off the supply of air to the cylinder chamber 20 while bringing the cylinder chamber 20 into communication with the atmosphere. Then, the spring 16 pulls the slider 15 back toward the take-up reel 34 (at the left in the figure), and the slider 15 forces the piston 21 in contact therewith back to the bottom dead center.

The spring 23 auxiliarily presses the pawl 25 against the ratchet 26. Because the cylinder chamber 20 communicates with the atmosphere when the feeding claw 28 turns the ratchet 26 in the direction of the arrow A, the rod 22 is allowed to move freely, with the result that the pawl 25 remains out of engagement with the teeth of the ratchet 26. As a consequence, the feeding claw 28 turns the ratchet 26 in the take-up direction of the tape (indicated by the arrow A), as shown at (II) in FIG. 5. Though the retreating slider 15 turns the bell crank 31 as well in this process, the take-up reel 34 does not turn in the opposite direction as it is connected to the rod 33 through the one-way constant-torque friction clutch 35.

Although an accelerating force acts thereon in the exposure process thereof, the component chip does not jump away from the base tape even when the feed is made at a high speed because the front and rear ends thereof are held by the walls of the recess provided thereon.

While the valve body 40 in this preferred embodiment is mechanically actuated by means of the chuck, a similar result can obviously be derived from the use of a solenoid valve actuated according to the motion of the suction nozzle 151 that is detected by means of a limit switch.

Figure 6:
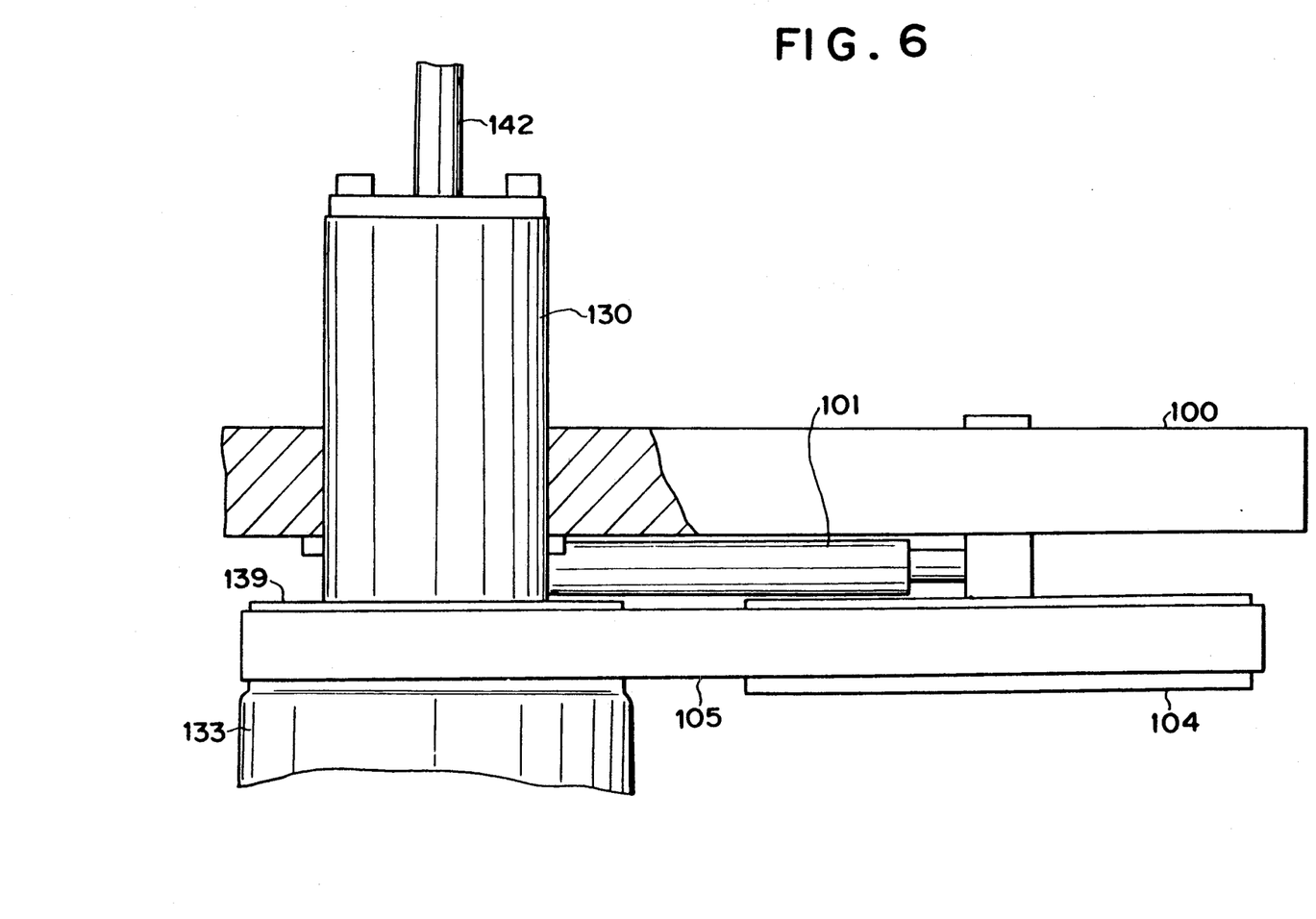
FIG. 6 is a front view of an example of a base on which a chuck is mounted.
Figure 7:
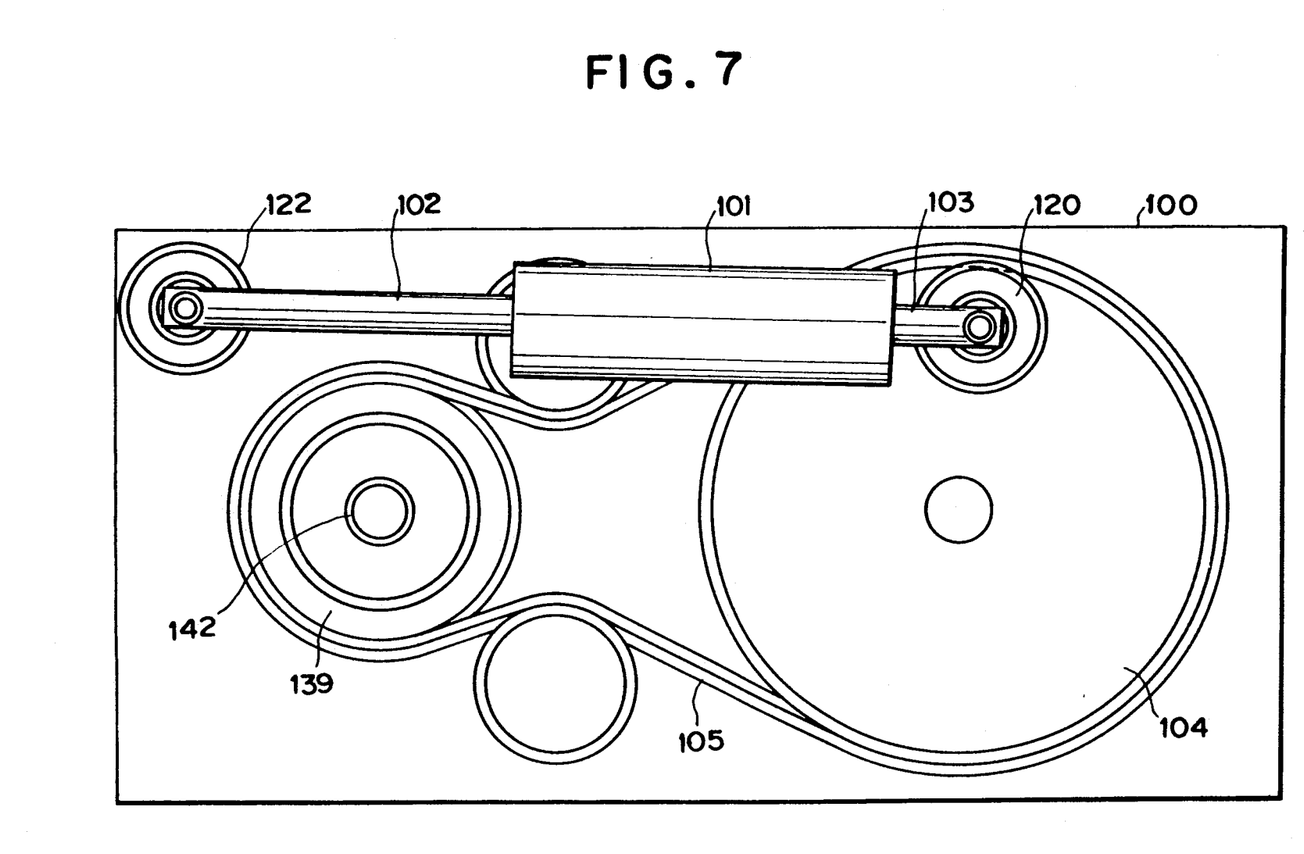
FIG. 7 is a bottom view of the same base.

FIGS. 6 and 7 show an example of a drive unit of the chuck to be described later. Reference numeral 100 designates a base attached to the drive unit 3 of the automatic assembling machine in such a manner as to permit two-dimensional motions. Under the base 100 is provided an air cylinder 101 in which two pistons reciprocate. While one piston rod 102 is connected to the base 100, the other piston rod 103 is connected to a pulley 104 that is, in turn, connected to an outer cylinder 133 of the chuck to be described later by means of a belt 105.

Figure 8:
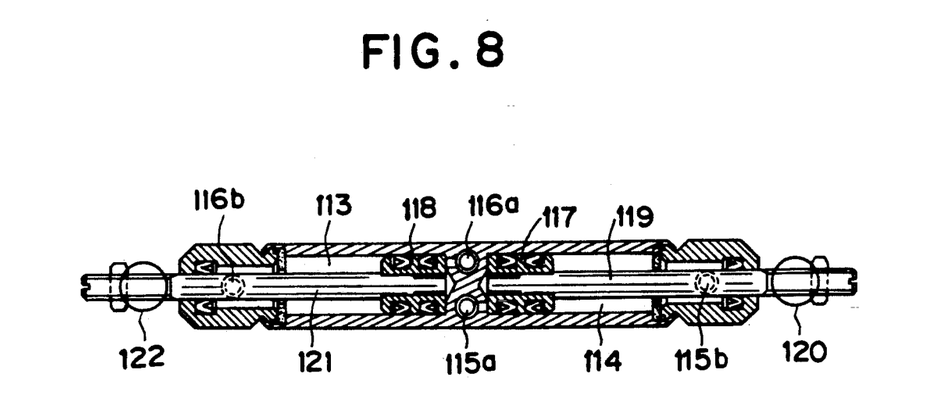
FIG. 8 is a cross-sectional view of an example of an air cylinder.

FIG. 8 shows an example of an air cylinder to drive the pulley 104. A cylinder 110 is divided into two cylinder chambers 113 and 114 by means of a partition wall 111 at the center. Air ducts 115a, 115b, 116a and 116b are provided to individually supply air to each of the cylinder chambers 113 and 114. The cylinder chambers 113 and 114 respectively accommodate pistons 117 and 118. While a drive pulley 104 is connected through a rotating member 120 to a rod 119 connected to the piston 117, the base 100 is connected through a rotating member 122 to a rod 121 connected to the other piston 118.

The strokes of the pistons 117 and 118 are adjusted so that the outer cylinder 133 is moved to the reference point when both pistons 117 and 118 are drawn to the partition wall 11, to the point 90 degrees away from the reference point when the piston 117 is pushed out, and to the point 180 degrees away from the reference point when both pistons 117 and 118 are pushed out. This permits selecting the position of the component chip at the tip of the suction nozzle 151 in a plane from among the reference point, 90 degrees (or 270 degrees) away from the reference point and 180 degrees away from the reference point.

Figure 9:
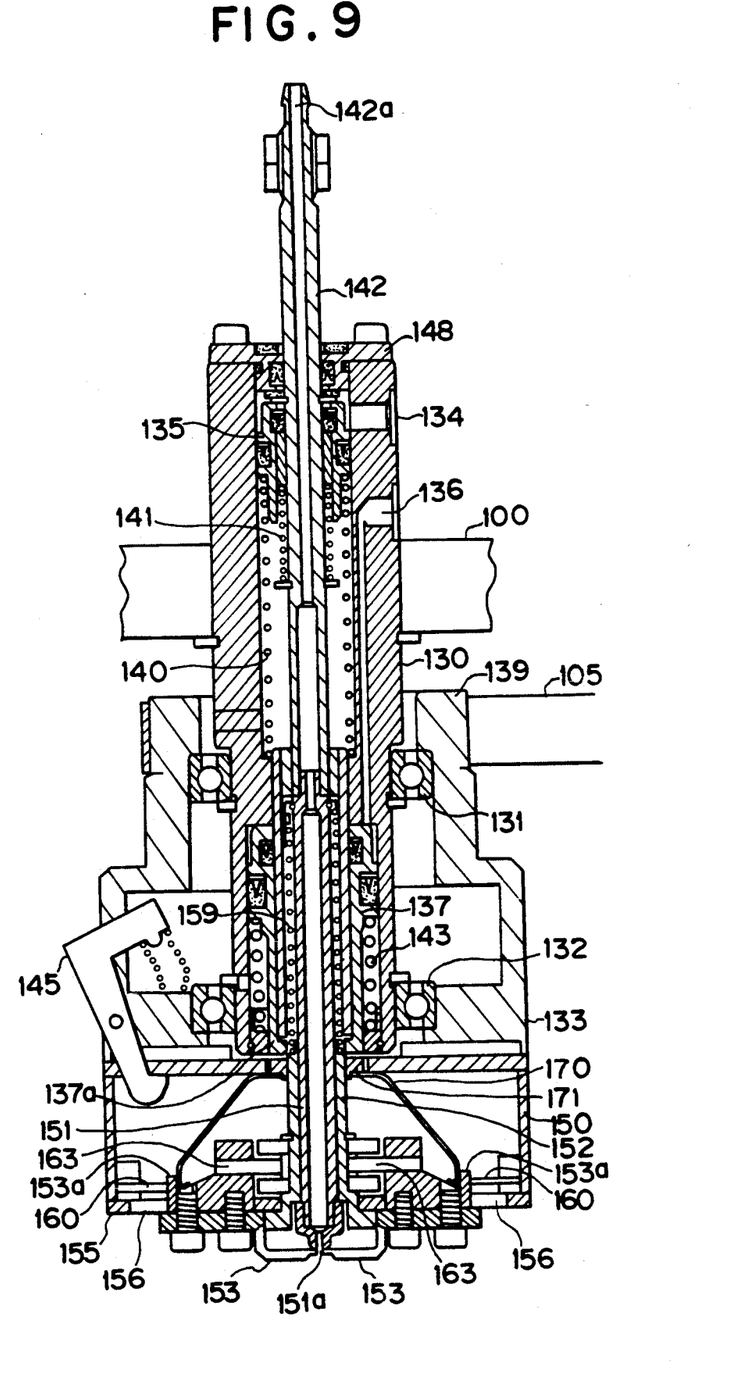
FIG. 9 is a cross-sectional view of a preferred embodiment of a component chip mounting chuck according to this invention.

FIG. 9 shows a chuck embodying the principle of this invention. Reference numeral 130 designates an inner cylinder whose upper end is fastened to the base 100. The inner cylinder 130 accommodates a first piston 135 that admits compressed air through an air intake 134 and a second piston 137 that admits compressed air through another air intake 136. While the first piston 135 is always urged upward by a spring 140, a vacuum supply tube 142 positioned at the center is fastened thereto through a spring 141. The vertically movable vacuum supply tube 142 is fitted in the inner cylinder 130 through a guide member 148, with an opening 142a at the top end thereof connected to a vacuum supply source. While the second piston 137 is always urged upward by a spring 143, the lower end thereof 137a is adapted to stick out of the inner cylinder 130. The outer cylinder 133 is rotatably fitted over the inner cylinder 130 through bearings 131 and 132, with a pulley 139 formed at the upper end thereof connected to the drive pulley 104 (shown in FIGS. 6 and 7) through a belt 105.

Reference numeral 150 indicates a head case that is detachably suspended from the outer cylinder 133 by means of a fastening claw 145, with a suction nozzle 151 to pick up a component chip by suction provided at the center thereof. A guide member 152 supports the axially reciprocatable suction nozzle 151 whose one end is always urged upward by a spring 159 held in contact with the guide member 152 and elastically brought into contact with the vacuum supply tube 142 in such a manner as to maintain airtightness. At the tip of the suction nozzle 151 is provided a nozzle orifice 151a whose size is smaller than the top surface of the component chip to be drawn thereby. The suction nozzle 151 is positioned so that, in a raised position, the tip of the nozzle orifice 151a is either substantially flush with paired jaws 153 and 154 to be described later or somewhat closer to the base 100.

Figure 10:
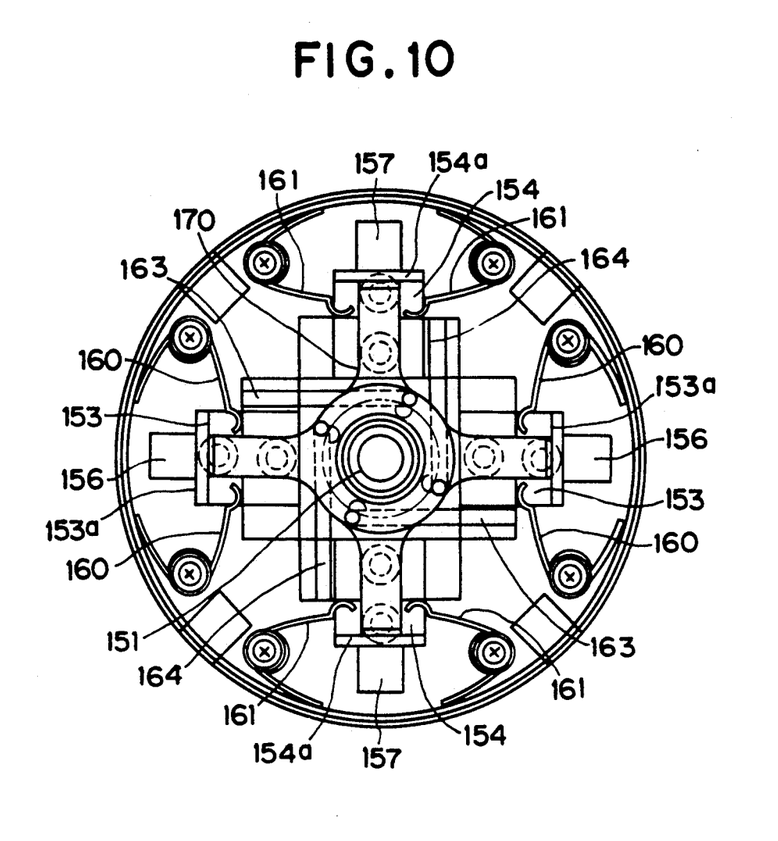
FIG. 10 is a top view showing the structure of the head segment of the same chuck.

The paired jaws 153 and 154 adapted to correct the posture and position of the component chip held at the nozzle orifice 151a by suction are inserted in slots 156 and 157 radially provided in the bottom plate 155 of the head case 150 in such a manner as to slide over the surface of the bottom plate 155. The jaws 153 and 154 are always urged by springs 160 and 161 so that the tips thereof are aligned with the center axis of the suction nozzle 151. At least four jaws 153 and 154 are provided around the suction nozzle 151 to hold the four sides of the component chip held in position. Coupled together by links 162 and 163, the two pairs of the facing jaws 153 and 154 are adapted to move an equal distance at an equal speed with respect to the center axis of the nozzle orifice 151a.

Reference numeral 170 denotes plate springs serving as motion converting devices set between a movable ring 171 fitted around the guide member 152 and holders 153a and 154a to keep the jaws 153 and 154 in place. The tips of the plate springs 170 expand when depressed by the descending ring 171.

Figure 11:
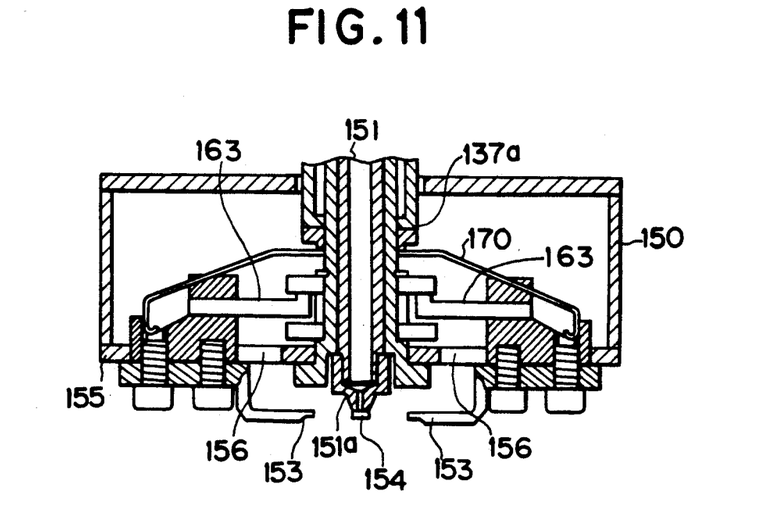
FIG. 11 is a cross-sectional view showing the head segment of FIG. 10, with the jaws attached thereto held open.
Figure 12A:
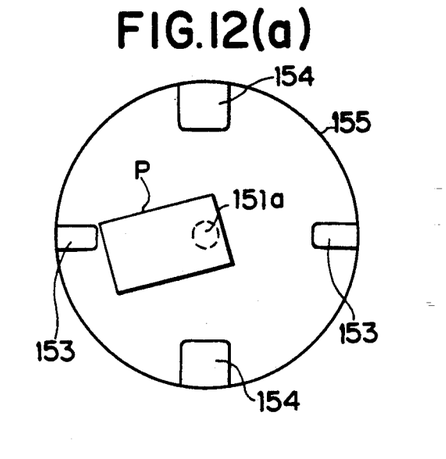
FIG. 12 schematically illustrated motions of the same chuck at (I) to (IV).
Figure 12B:
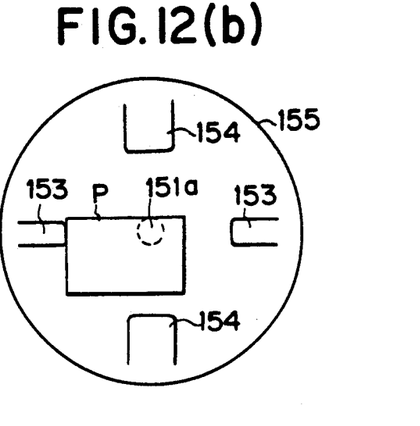
Figure 12C:
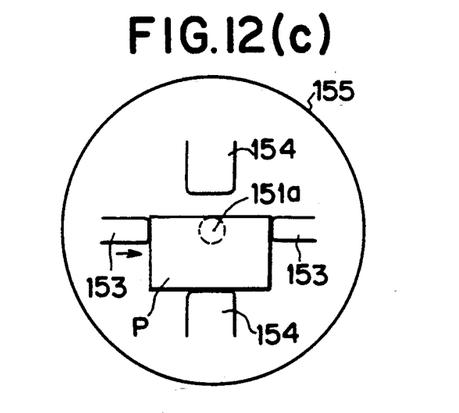
Figure 12D:
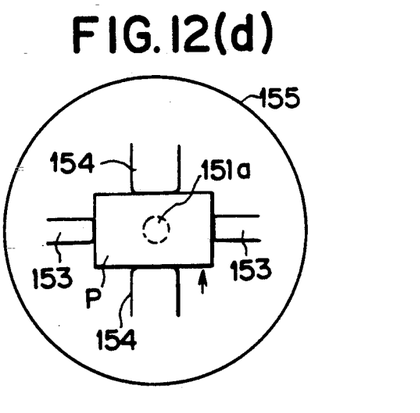

When air is admitted through the air intake 136, the second piston 137 depresses the ring 171 against the force of the spring 143, whereby the plate springs 170 cause the jaws 153 and 154 to move, against the force of the springs 160 and 161, radially through the slots 156 and 157 along the surface of the bottom plate 155. Then, the tips of the jaws 153 and 154 move apart to expose the tip of the suction nozzle 151, as shown in FIG. 11.

When air is admitted through the air intake 134 in this state, the first piston 135 is depressed to press down the vacuum supply tube 142 through the spring 141. As the suction nozzle 151 descends, the nozzle orifice 151a comes in contact with the component chip exposed from the base tape. If the piston 135 continues to descend further after the nozzle orifice 151a comes in contact with the component chip, the spring 141 contracts to prevent the suction nozzle 151 from applying unwanted excess pressure on the component chip.

When vacuum is supplied through the vacuum supply tube 142, the nozzle orifice 151 draws the component chip by suction. When the air supply through the air intake 134 is stopped to bring the cylinder 130 into communication with the atmosphere, the spring 140 pushes back the piston 135 upward, whereby the nozzle 151 connected thereto ascends back to the original position (shown in FIG. 9) together with the component chip at the tip thereof.

When the air supply through the air intake 136 is stopped to bring the cylinder 130 into communication with the atmosphere, the spring 143 pushes back the piston 137 upward. As the plate springs no longer exert force, the springs 160 and 161 urge the jaws 153 and 154 to move toward the nozzle 151 through the slots 156 and 157 along the surface of the bottom plate 155. The precision of the sliding motion of the jaws 153 and 154 along the bottom plate 155 depends on the surface smoothness of the bottom plate 155 and the accuracy with which the slots 156 and 157 are finished.

The facing jaws 153 and 154 coupled together by the links 163 and 164 thus move toward the center of the suction nozzle 151, traveling an equal distance at an equal speed. If the center of the sucked component chip is misaligned with the center axis of the nozzle orifice 151a, therefore, the most projecting side of the component chip P comes in contact with the forward end of the facing jaw 153 as shown at (I) in FIG. 12. As the jaws 153 and 154 continue to move toward the center, the forward end of the jaw 153 that first came in contact pushes the component chip P to correct the orientation thereof by paralleling the projecting side thereof with the surface of the forward end of the jaw 153 as shown at (II) in FIG. 12. Held in position by the suction nozzle 151 only by suction, the component chip P slides over the surface of the nozzle orifice 151a following the motion of the jaw 153.

As the jaws 153 and 154 move closer to the center, the jaws 153 bring the component chip P into alignment with the center axis of the nozzle 151, thereby aligning the nozzle orifice 151a with the center of length of the component chip P, as shown at (III) in FIG. 12. Then, the jaws 154 comes in contact with the component chip P to move it breadthwise toward the center, as shown at (IV) in FIG. 12. Because the jaws 153 and 154 coupled together by the links 163 and 164 are adapted to move an equal distance toward the center of the nozzle orifice 151a, the center axis of the nozzle orifice 151a is completely aligned with the center of the component chip P when all jaws 153 and 154 are in contact therewith, with the jaws 153 and 154 squarely holding the component chip P in the right position.

The angular relationship between the component chip held at the nozzle orifice 151a and the circuit board can be changed by turning the outer cylinder 133 by increments of 90 degrees by supplying air into the air cylinder 101 shown in FIG. 7 to turn the jaws 153 and 154 by the same increments. Then, the component chip changes its orientation in accordance with the motion of the outer cylinder 133.

The coaxial arrangement of heavier components, such as the pistons 135 and 137, with the vacuum supply tube 142 serving as the axis of rotation permits minimizing the moment of inertia of the entire chuck, thus permitting a quick rotation and stop necessitated by the quick and precision positioning of the component chip.

The drive unit 3 shown in FIG. 3 moves the entirety of the chuck, with the component chip held in position with respect to the center axis of the suction nozzle 151, to the desired point on the printed circuit board. After opening the jaws 153 and 154 by supplying air through the air intake 136, the supply of air through the air intake 134 brings down the suction nozzle 151 into contact with the printed circuit board. When the vacuum supply through the vacuum supply tube 142 is cut off, the component chip released from the nozzle orifice 151a is placed in position on the printed circuit board.

Figure 13A:
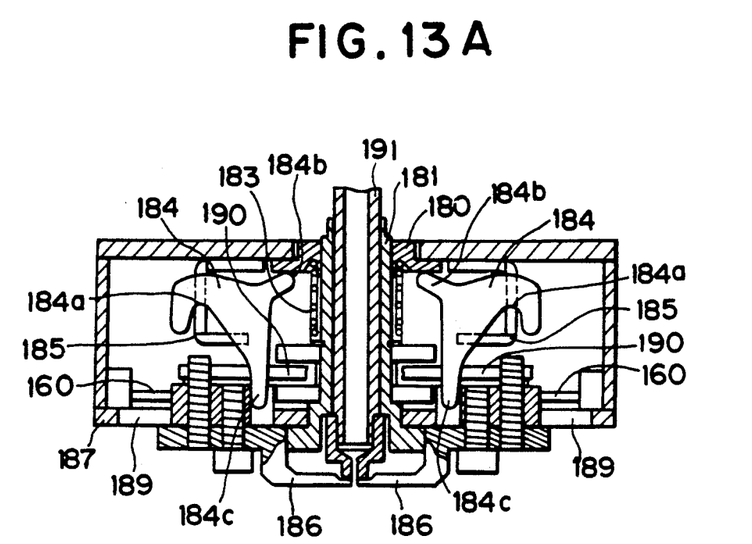
FIG. 13 shows cross-sections of another preferred embodiment of this invention, with the jaws thereof closed and opened, at (a) and (b).
Figure 13B:
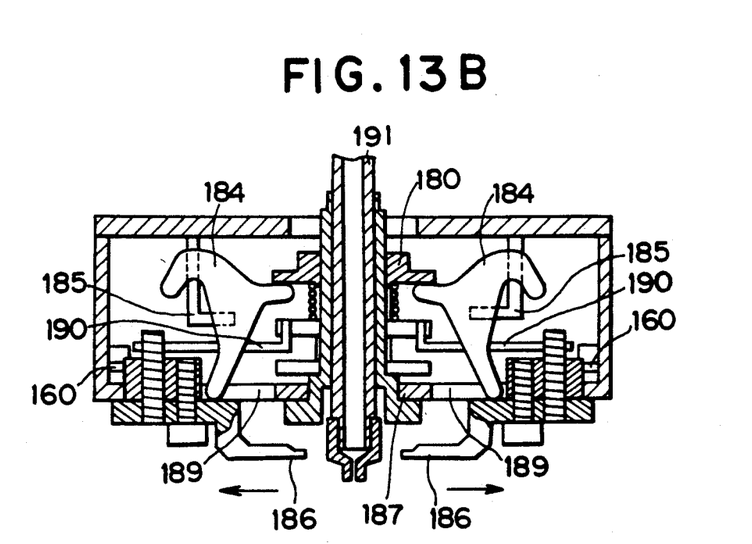

FIG. 13 shows another preferred embodiment of the head segment at (a) and (b). Reference numeral 180 indicates a ring that is always urged upward by a spring 183. A second piston 137 accommodated in an inner cylinder 130 moves up and down a guide member 181. Reference numeral 184 designates three-prong levers serving as motion converting mechanisms, each of which having a hook-like recess at one end thereof whose junction with a fixed bracket 185 serves as a fulcrum 184a. While another end 184b of the lever 184 is in contact with the ring 180, a third end 184c is in contact with each of jaws 186 to be described later. The jaws 186 which are always urged toward a suction nozzle 191 by springs 185 are coupled together by a link 190.

When the second piston 137 (shown in FIG. 9) in this embodiment depresses the ring 181, each lever 184 turns about the fulcrum 184a to expand the jaw 186 held in contact with one end 184c thereof along the surface of a bottom plate 187. Guided by slots 189 in the bottom plate 187 and the surface thereof, the jaws 186 radially move outward parallel to the surface of the bottom plate 187, as shown at (b) in FIG. 13.

When air is admitted through an air intake 134, the piston 135 (shown in FIG. 9) descends to enable a nozzle orifice 151a at the tip of a suction nozzle 191 to pick up a component chip by suction. When the air supply to the first piston 135 is cut off on completion of the pickup of the component chip by the nozzle orifice 151a, the nozzle 151 moves upward together with the sucked component chip. When the air supply to the second piston 137 is cut off in this state, the jaws 186 urged by the springs 185 move toward the nozzle orifice 151 until the tips thereof come in contact with the opposite sides of the component chip to align the suction nozzle with the center thereof.

Figure 14A:
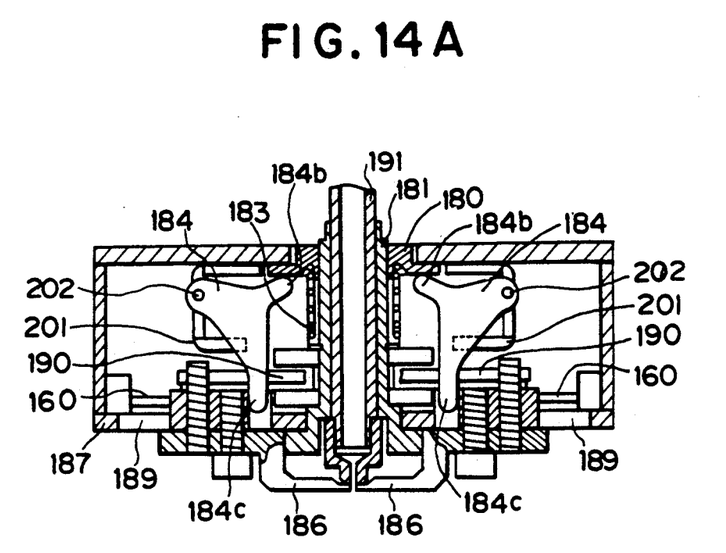
FIG. 14 shows cross-sections of still another preferred embodiment of this invention, with the jaws thereof closed and opened, at (a) and (b).
Figure 14B:
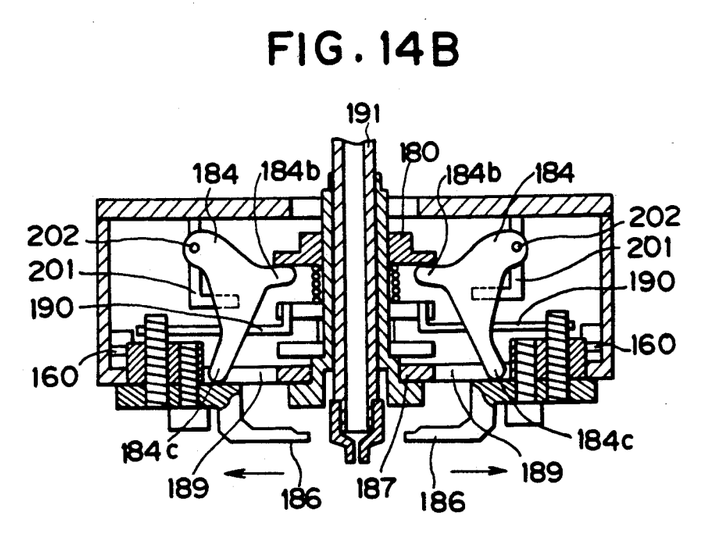

The three-prong lever 184 in this embodiment turns about the fulcrum positioned at the junction of the hook-like recess thereof with the fixed bracket 185. By comparison, a lever 200 shown in FIG. 14 turns more smoothly by means of a pin 202 mounted on a fixed bracket 201 and rotatably passed through a hole provided at the fulcrum of the lever 200.

The outer cylinder 130 in the above preferred embodiment is connected to a pulley through a belt 105 to permit rotation by an air cylinder. By comparison, an outer cylinder directly driven by a pulse motor or other electric drive unit permits freer angular positioning of the component chip.

What is claimed is:

1. A chuck for positioning an electric component on a chip comprising a head segment and a base segment; the head segment comprising a head case accommodating an axially movable suction nozzle to hold the component on a chip by suction at the center thereof, at least four jaws that are attached to the bottom plate of the head case, symmetrically disposed around the axis of the suction nozzle and adapted to move radially with respect to said axis and parallel to the surface of the bottom plate, said jaws moving horizontally sliding over said bottom plate, links to couple together each pair of facing jaws disposed on opposite sides of said axis, elastic means to urge the jaws toward said axis, and motion converting means to radially move the jaws by the action of first driving means toward the axis of the suction nozzle and second driving means to move the suction nozzle in the direction of said axis; and
the base segment accommodating said first and second driving means.

2. A chuck for positioning an electric component on a chip according to claim 1, in which the base segment comprises an inner cylinder fastened to a base and an outer cylinder rotatable with respect to said inner cylinder, the inner cylinder accommodating the first and second driving means, and the head segment is detachably attached to the outer cylinder.

3. A chuck for positioning an electric component on a chip according to claim 2, in which the head segment is rotated by the action of an external power unit about the axis of the suction nozzle which is movable only in the direction of the axis thereof.

4. A chuck for positioning an electric component on a chip according to claim 1, in which the motion converting means comprises radially extending plate springs, with the tips thereof kept in contact with the jaws, which are adapted to open radially when the first driving means exerts a pressure thereon.

5. A chuck for positioning an electric component on a chip according to claim 1, in which the motion converting means comprises cams that are adapted to radially open the lower ends thereof about the fulcrum thereof when the first driving means exerts a pressure thereon.

6. A chuck for positioning an electric component on a chip according to claim 5, in which the fulcrum of the cams is provided by a recess formed therein.

7. A chuck for positioning an electric component on a chip according to claim 5, in which the fulcrum of the cams is provided by a combination of a hole provided therein and a pin passed therethrough.

8. A chuck for positioning an electric component on a chip according to claim 1, in which the vacuum supplied to the suction nozzle is of such a level as is enough to permit the suction nozzle to slide with the sucked electric component on a chip under the influence of the force exerted by the jaws.

* * * * *